United States Patent
Glatz et al.

(10) Patent No.: US 10,706,984 B2
(45) Date of Patent: Jul. 7, 2020

(54) ANTI-SCATTER GRID

(71) Applicant: PLANSEE SE, Reutte (AT)

(72) Inventors: Wolfgang Glatz, Reutte (AT); Heinrich Kestler, Reutte (AT); Bernhard Tabernig, Pflach (AT)

(73) Assignee: Plansee SE, Reutte (AT)

( * ) Notice: Subject to any disclaimer, the term of this patent is extended or adjusted under 35 U.S.C. 154(b) by 201 days.

(21) Appl. No.: 15/546,375

(22) PCT Filed: Jan. 22, 2016

(86) PCT No.: PCT/AT2016/000004
§ 371 (c)(1),
(2) Date: Jul. 26, 2017

(87) PCT Pub. No.: WO2016/118989
PCT Pub. Date: Aug. 4, 2016

(65) Prior Publication Data
US 2018/0268952 A1 Sep. 20, 2018

(51) Int. Cl.
*G21K 1/02* (2006.01)
*C23C 14/16* (2006.01)

(52) U.S. Cl.
CPC .............. *G21K 1/025* (2013.01); *C23C 14/16* (2013.01)

(58) Field of Classification Search
CPC ..................................................... C23C 14/16
See application file for complete search history.

(56) References Cited

U.S. PATENT DOCUMENTS

| | | | |
|---|---|---|---|
| 5,721,761 A | 2/1998 | Ferlic et al. | |
| 6,445,772 B1 * | 9/2002 | Campbell | G21K 1/02 250/390.1 |
| 6,744,852 B2 | 6/2004 | Klotz et al. | |
| 6,980,629 B1 * | 12/2005 | Hoheisel | G21K 1/025 264/401 |
| 7,149,283 B2 | 12/2006 | Hoheisel et al. | |
| 2002/0037071 A1 | 3/2002 | Kohda | |
| 2003/0081731 A1 | 5/2003 | Souchay et al. | |
| 2003/0222581 A1 | 12/2003 | Niimi | |
| 2004/0028181 A1 * | 2/2004 | Charles, Jr. | A61B 6/032 378/92 |
| 2005/0084072 A1 | 4/2005 | Pinchot | |

(Continued)

FOREIGN PATENT DOCUMENTS

| | | |
|---|---|---|
| CA | 953167 A | 8/1974 |
| CN | 101934607 A | 1/2011 |

(Continued)

*Primary Examiner* — Hugh Maupin
(74) *Attorney, Agent, or Firm* — Laurence A. Greenberg; Werner H. Stemer; Ralph E. Locher

(57) ABSTRACT

An x-ray and/or gamma radiation absorbing slat, for use in an anti-scatter grid having a layer configuration, includes a film-shaped substrate of a metallic material on the basis of at least one heavy metal and at least one coating layer of a material on the basis of at least one metal from the group tin, antimony, tantalum, tungsten, rhenium, iridium, platinum, gold or bismuth. The material of the coating layer differs from the material of the film-shaped substrate. An anti-scatter grid for x-ray and/or gamma radiation, a method for producing an x-ray and/or gamma radiation absorbing slat and a method of producing an anti-scatter grid, are also provided.

11 Claims, 3 Drawing Sheets

(56) References Cited

U.S. PATENT DOCUMENTS

2012/0163553 A1    6/2012  Deych et al.
2013/0272505 A1   10/2013  Beck

FOREIGN PATENT DOCUMENTS

| | | |
|---|---|---|
| DE | 102013204269 A1 | 9/2014 |
| EP | 1400984 A2 | 3/2004 |
| EP | 1280165 B1 | 9/2010 |
| GB | 1522036 A | 8/1978 |
| JP | 2001238879 A | 9/2001 |
| JP | 2002174696 A | 6/2002 |
| JP | 2004198794 A | 7/2004 |
| JP | 2008168110 A | 7/2008 |
| JP | 2009050654 A | 3/2009 |
| JP | 2012122840 A | 6/2012 |

* cited by examiner

ANTI-SCATTER GRID

BACKGROUND OF THE INVENTION

Field of the Invention

The present invention relates to an x-ray or gamma radiation absorbing slat for use in an anti-scatter grid, to a method for producing such a slat and to an anti-scatter grid.

Anti-scatter grids are used in imaging processes involving x-ray, gamma or particle radiation, for example in radiography for imaging by means of x-radiation or in nuclear diagnostics for the use of gamma cameras. In such cases, the anti-scatter grid is arranged upstream of the radiation detector (for example x-ray film, gas or solid detector) and has the effect that only radiation of a certain spatial direction (primary radiation) reaches the detector, while the incidence of scattered radiation on the detector is suppressed. Scattered radiation unavoidably occurs in the object of examination, including due to scattering of the primary radiation emanating from the radiation source (for example x-ray source) and passing through the object of examination. While the primary radiation is aligned in a preferential direction, scattered radiation is undirected and oriented in any directions in relation to the detector system. Scattered radiation is undesired, since it represents a source of noise and considerably impairs the contrast of the image taken. To achieve high image quality, the anti-scatter grid should have a high absorptivity with respect to scattered radiation, a high transmissivity with respect to primary radiation and avoid instances of shading of the primary radiation.

Anti-scatter grids consist of structures which absorb the corresponding radiation, are arranged at regular spacings and are aligned in the direction of the desired primary radiation, and between which through-channels or through-slits are provided for the primary radiation to pass through as unattenuated as possible.

Various embodiments of anti-scatter grids, adapted for various application purposes, are known in the prior art. In the case of x-ray computed tomography apparatuses, for example, anti-scatter grids in which the radiation-absorbent structures are given the form of small plates comprising sheets of tungsten or tungsten-heavy metal alloys that are arranged at defined spacings from one another are preferably used. The passing-through regions between the radiation-absorbent plates are open and, for reasons of stability, the thickness of the plates is usually about 80 to 100 µm. As a result of the thickness of the plates, disadvantageous effects of shading of the primary radiation occur, necessitating higher x-ray dosages for imaging.

In digital radiography, moreover, slat-like anti-scatter grids are known, formed from alternately stacked thin strips (slats) of highly x-ray-absorbent material such as lead and thin strips of x-ray-transmissive material, such as for example paper. Such an anti-scatter grid in slat form is disclosed in EP1280165B1. The radiation-transmissive slats, of paper for example, act as spacers between the thin lead films, which typically have a layer thickness of about 20 to 50 µm and are aligned parallel to the direction of the primary radiation. The use of spacer slats allows the radiation-absorbent lead slats to be made relatively thin, but for production reasons the minimum thickness of the lead films is restricted to about 15 to 30 µm, as a result of which the primary radiation is also partially shielded. Particularly disadvantageous when using lead are potential environmental risks that the use of lead entails. For reasons of environmental protection, there is therefore a great demand in industry for an alternative solution to lead.

US20030081731 discloses an anti-scatter grid in which a grid-shaped main body produced stereolithographically from a radiation-transmissive polymer material is coated with a radiation-absorbent metal layer. In an additional production step, the metal layer must be etched away at the end faces of the anti-scatter grid.

SUMMARY OF THE INVENTION

The object of the invention is to provide an x-ray and/or gamma radiation absorbing slat for an anti-scatter grid, a method for producing a radiation-absorbent slat and also an anti-scatter grid for shielding x-ray and/or gamma radiation with which the use of lead is avoided and there is as little shading as possible of the primary radiation.

The object is achieved by an x-ray and/or gamma radiation absorbing slat for use in an anti-scatter grid as described below. Advantageous developments of the invention are specified in the sub claims.

According to the present invention, the slat has a layer arrangement in which a film-like substrate of a metallic material on the basis of at least one heavy metal is coated with at least one coating layer of a material on the basis of at least one metal from the group tin, antimony, tantalum, tungsten, rhenium, iridium, platinum, gold or bismuth. The material of the coating layer differs from the material of the film-like substrate. The slat is radiation-absorbent and, when used in an anti-scatter grid, is stacked alternately with a radiation-transmissive slat.

A material on the basis of a metal refers to a pure metal or an alloy of the metal that consists in respect of at least 50% by weight (percent by weight) of the metal concerned. In particular, the alloy consists in respect of at least 90% by weight of the metal concerned. In the case of an alloy, apart from the metal concerned the material also contains further metals or else small proportions of nonmetallic additives, such as for example oxides, and/or dopants.

Used as the film-like substrate for the coating layer(s) are backing films of a heavy metal or alloys thereof, heavy metals being taken to mean metals with a density of >5 $g/cm^3$ (except lead). Suitable in particular as the substrate material are heavy metals or alloys thereof with good radiation absorption properties in relation to the material volume, i.e. high density and high atomic number, the material costs and production costs of the film-like substrate and the compatibility with the coating material also having to be taken into consideration in the selection of materials. With regard to considerations of cost-effectiveness and radiation absorption properties, metallic backing films of a material on the basis of iron (steel), nickel, copper or molybdenum or tin have proven to be advantageous for the film-like substrate. If cost aspects are secondary, backing films of a material on the basis of molybdenum should be preferred because of the good radiation absorption properties of molybdenum.

Apart from the precious metals iridium, platinum and gold, the refractory metals tantalum, tungsten and rhenium that are used in the coating layer have a high density and high atomic number, and consequently a high absorption coefficient in relation to the material volume with respect to x-ray and gamma radiation.

The slat therefore has a layer-like structure, the coating layer(s) preferably extending over the entire two-dimensional extent of the film-like substrate. As a difference from US20030081731, where a radiation-opaque layer is applied to a main body of a radiation-transmissive material, in the case of the present invention a substantially radiation-opaque substrate is coated. The slat is therefore distinguished by a high radiation absorption capacity, since both the film-like substrate and the coating layer of the slat contribute to the radiation shielding. The choice of a substrate material and coating material with a high radiation absorption coefficient allows slats with an extremely small thickness to be achieved while providing the required absorption of scattered radiation, whereby undesired absorption of the primary radiation can be kept down.

It is advantageous that the layer-like structure allows the use of metals with a great radiation absorption coefficient, such as in particular tungsten, which is poor in terms of being mechanically worked but can be applied by means of a coating process. Tungsten has a much higher absorptivity in relation to the material volume with respect to x-ray and gamma radiation than lead, but cannot be rolled in an economically reasonable way in the form of a thin strip with a thickness of approximately 15 to 30 µm, as is required for a slat of an anti-scatter grid. Tungsten is therefore a particularly preferred coating material for the slat.

In an advantageous embodiment, the x-ray or gamma radiation absorption coefficient of the substrate material (in relation to the material volume) is less than the absorption coefficient of the material of the coating layer(s). This material combination for the slat layer arrangement may be of interest in particular from economic considerations, if low-cost backing films of for example steel, nickel or copper, which have a comparatively low radiation absorption coefficient, are used as the substrate. To achieve a higher effective absorption of scattered radiation of the slat, the low-cost backing film is coated with a coating material with a higher absorptivity, for example with a refractory metal such as tungsten.

The film-like substrate may be coated on one side with at least one coating layer. A one-sided coating is suitable in particular in the case of coating processes such as physical vapor deposition (PVD), chemical vapor deposition (CVD), thermal spraying processes or slurry processes, in which only one side of the substrate is coated in a process step. PVD processes are particularly advantageous, since they allow very dense layers to be deposited.

In an advantageous embodiment, the film-like substrate may also be coated on both sides with at least one coating layer. In an embodiment coated on both sides, at least one coating layer is applied on both side surfaces of the film-like substrate; in this case, the layer arrangement of the slat consists of at least three layers, the middle layer being the film-like substrate. Film-like substrates coated on both sides can be produced for example by means of electroplating processes, for example in a melt bath by means of high-temperature fused salt electrolysis. The coating layer on the two side surfaces of the substrate preferably consists of the same material. Such a substrate coated on both sides offers the advantage that instances of bending of the slat, which may occur when there are changes in temperature because of a difference in the coefficient of thermal expansion between the substrate material and the coating material, are reduced.

According to a preferred embodiment, the thickness of the slat is between 10 µm and 60 µm, in particular between 15 µm and 30 µm. With this thickness, a coated film has a sufficient intrinsic stability for the mechanical production process of the slat. If tungsten or a tungsten alloy is used as the coating material, the slats can be designed to be particularly thin on account of the high radiation absorption coefficient of tungsten. It is extremely desirable with regard to the adverse effects of shielding and shading of the primary radiation for the slat to be made as thin as possible.

A particularly advantageous embodiment for the slat is a layer arrangement with a film-like substrate of a molybdenum-based material that is coated on one or both sides with a tungsten-based material. Tungsten-based material refers to pure tungsten or a tungsten alloy that consists in respect of at least 50% by weight, in particular up to 90% by weight, of tungsten. In the case of a tungsten alloy, it comprises still further metals, for example rhenium. By analogy, molybdenum-based material refers to pure molybdenum or a molybdenum alloy that consists in respect of at least 50%, in particular at least 90%, of molybdenum and possibly contains further metals or small proportions of non-metallic additives and/or dopants.

To produce the slat, a thin metal film of molybdenum is rolled to a thickness of approximately 10 µm to 25 µm and before the coating process is possibly also pretreated electrochemically or conditioned for the coating by pickling. The metal film is coated with tungsten in a PVD coating installation, in particular in a roll-to-roll coating installation. The thickness of the tungsten layer is preferably between 5 and 25 µm, in particular between 5 and 15 µm. The starting material for the slat can be produced as a metal film strip that can be wound up into a coil. The molybdenum-tungsten combination of materials is particularly advantageous, because molybdenum as a backing material effectively absorbs x-ray or gamma radiation, and consequently extremely effective radiation shielding in relation to the material volume can be achieved in combination with the highly radiation-absorbent tungsten layer. On account of the higher radiation absorption in relation to the material volume, an anti-scatter grid slat of molybdenum-tungsten can be dimensioned with a smaller thickness in comparison with a lead slat to achieve the same performance in the absorption of scattered radiation. As a result of the smaller slat thickness, the undesired absorption of the primary radiation is less (with the same absorption of scattered radiation). The tungsten layer is also distinguished by great adhesiveness on the molybdenum film. In general, the two materials, molybdenum and tungsten, are very similar in their physical and chemical properties, for example they have a comparable coefficient of thermal expansion. For example under the thermal loads occurring during the coating process, the similarity in the coefficients of thermal expansion prevents temperature-induced stresses or instances of bending, as would occur in the case of a bimetal strip of metals with different coefficients of thermal expansion. The film-like molybdenum-tungsten material composite also has a greater stiffness and strength in comparison with a lead film, as a result of which slats with a greater intrinsic stability in comparison with a lead slat can be achieved.

The object is also achieved by a production method as claimed in claim 9. To produce an x-ray and/or gamma-radiation absorbent slat, in a first method step a thin film is produced from a metallic material on the basis of at least one heavy metal by known forming processes such as rolling, etc. A film on the basis of iron, nickel, copper, molybdenum or tin may be used in particular as a starting basis for the slat. Typically, the thickness of the film is between 5 µm and 30 µm, preferably between 10 µm and 25 µm. The film is subsequently coated with a metallic material on the basis of at least one metal from the group tin, antimony, tantalum, tungsten, rhenium, iridium, platinum, gold or bismuth. The material of the coating layer differs from the material of the film. These coating materials are distinguished by a high radiation absorption coefficient. Preferably, a coating layer with a thickness of between 5 µm and 50 µm, in particular between 5 µm and 20 µm, is applied. Processes that are known to a person skilled in the art, such as physical vapor deposition (PVD), chemical vapor deposition (CVD), thermal spraying processes, slurry processes or electroplating processes such as high-temperature fused salt electrolysis, come into consideration as coating processes. For applied layers with a layer thickness greater than approximately 20 µm, electroplating processes should be preferred over vapor deposition processes. Before the coating process, the film may also optionally be prepared for the coating operation in an intermediate step (by pickling or electrochemical conditioning). The coated metal film thus obtained can be wound into a coil and used in the production process for an anti-scatter grid, where it is cut into a corresponding strip form. The advantages explained above with reference to the slat according to the invention are achieved by the production method.

The object is also achieved by a production method as follows. To produce an x-ray and/or gamma-radiation absorbent slat, in a first method step a thin film is produced from a metallic material on the basis of at least one heavy metal by known forming processes such as rolling, etc. A film on the basis of iron, nickel, copper, molybdenum or tin may be used in particular as a starting basis for the slat. Typically, the thickness of the film is between 5 µm and 30 µm, preferably between 10 µm and 25 µm. The film is subsequently coated with a metallic material on the basis of at least one metal from the group tin, antimony, tantalum, tungsten, rhenium, iridium, platinum, gold or bismuth. The material of the coating layer differs from the material of the film. These coating materials are distinguished by a high radiation absorption coefficient. Preferably, a coating layer with a thickness of between 5 µm and 50 µm, in particular between 5 µm and 20 µm, is applied. Processes that are known to a person skilled in the art, such as physical vapor deposition (PVD), chemical vapor deposition (CVD), thermal spraying processes, slurry processes or electroplating processes such as high-temperature fused salt electrolysis, come into consideration as coating processes. For applied layers with a layer thickness greater than approximately 20 µm, electroplating processes should be preferred over vapor deposition processes. Before the coating process, the film may also optionally be prepared for the coating operation in an intermediate step (by pickling or electrochemical conditioning). The coated metal film thus obtained can be wound into a coil and used in the production process for an anti-scatter grid, where it is cut into a corresponding strip form. The advantages explained above with reference to the slat according to the invention are achieved by the production method.

The object is achieved by an anti-scatter grid as follows. The slat according to the invention serves for the absorption of the scattered radiation and is assembled alternately with so-called spacer slats of material transmissive to x-ray or gamma radiation (spacer material) in a known way to form an anti-scatter grid in the form of slats. In this case, the coated metal film strip in the form of a coil (typically with a length of approximately 50 m or more and a width in the range of several cm, for example approximately 3 to 5 cm) is precut in a suitable cutting device into strip form; depending on the application and the production process, such a strip is typically approximately 15 to 20 cm long and approximately 3 cm wide. These radiation-absorbent slats are stacked alternately with spacer slats in strip form (for example of paper, a fiber composite or of plastics such as polyethylene, polystyrene or polypropylene) in a stacking device, required focal alignment with a point of convergence (radiation source) having to be taken into consideration in the alignment of the individual slats. The stack comprising the individual slats can be adhesively bonded with a suitable adhesive, such as for example epoxy resin, fixed under the effect of heat and subsequently cut into individual anti-scatter grids. However, embodiments of the anti-scatter grid in which the stack of slats is only held together by being pressed together in a corresponding frame, without adhesive, are also conceivable.

The anti-scatter grid according to the invention is also referred to as a 1-dimensional anti-scatter grid, since a 1-dimensional collimation of the radiation incident on the anti-scatter grid is achieved.

BRIEF DESCRIPTION OF THE SEVERAL VIEWS OF THE DRAWING

The invention is explained in more detail below on the basis of the drawings, in which.

DESCRIPTION OF THE INVENTION

Figure 1:
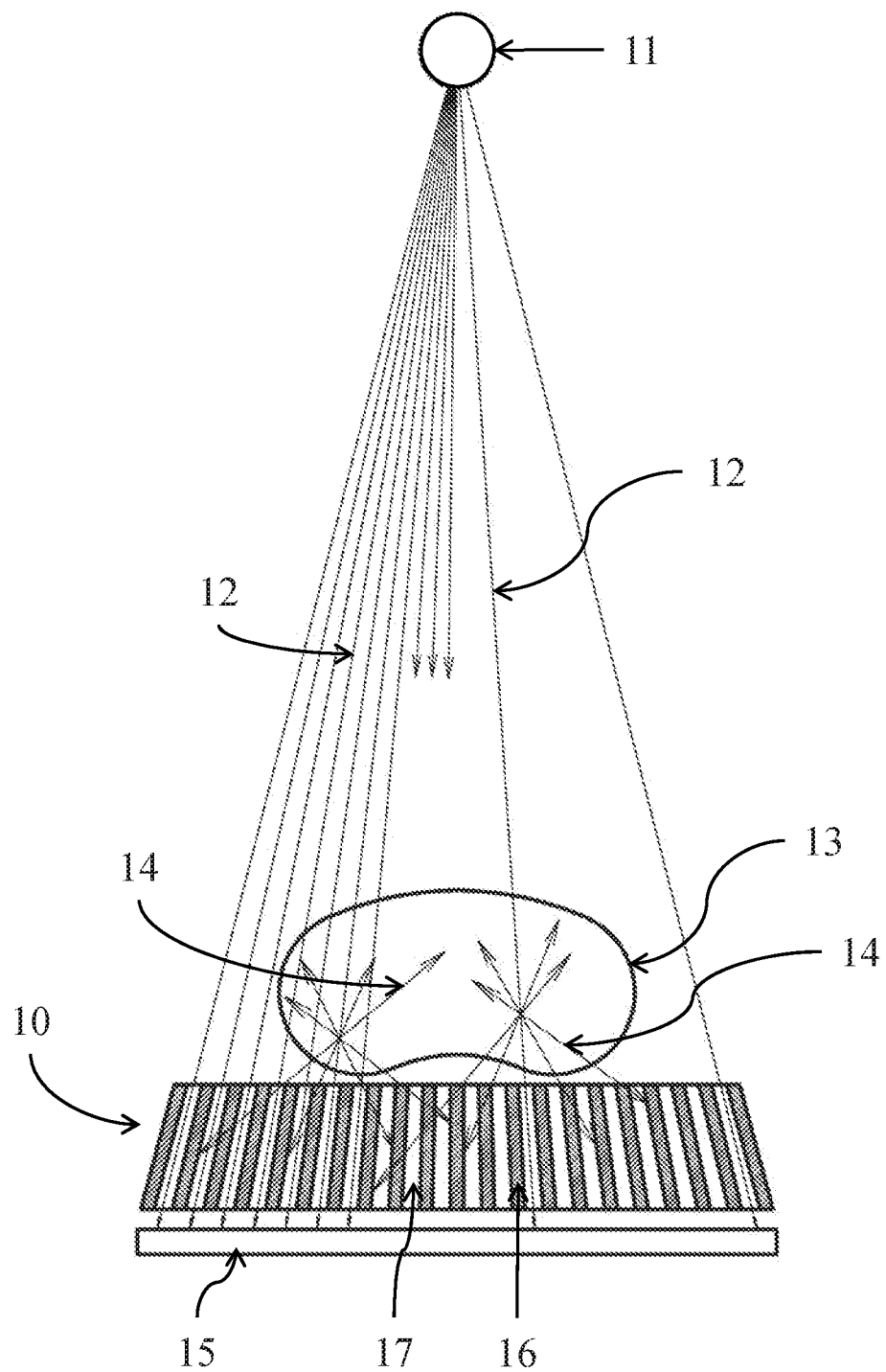
FIG. 1 shows a schematic cross-sectional representation of an anti-scatter grid in use in an x-ray installation.

In FIG. 1, an anti-scatter grid (10) in an x-ray installation is schematically represented. The x-radiation (primary radiation) (12) generated in an x-ray source (11) is incident on an object of examination (13), for example a human body, with which it interacts and whereby scattered radiation (14) is produced. The x-radiation passing through the object of examination, both primary radiation and undirected scattered radiation, is subsequently incident on the anti-scatter grid (10), which is arranged upstream of an x-ray detector (15) in the direction of radiation. The x-ray detector (15) detects the intensity distribution of the incident x-radiation.

The anti-scatter grid (10) (represented in FIG. 1 in a cross section in a plane perpendicular to the longitudinal direction of the slats in strip form) has a multiplicity of slats in strip form, x-ray-absorbent slats (16) and x-ray-transmissive slats (17) being arranged alternately. The slats (16, 17) are arranged in one plane, substantially perpendicular to the incident primary radiation and substantially parallel in their longitudinal direction (the longitudinal direction is perpendicular to the cross-sectional plane represented). As indicated in FIG. 1, the slats (16, 17) are preferably aligned with the focal point of the x-ray source (11), i.e. the slats (16, 17) are not exactly parallel to one another but are tilted at a very small angle in relation to one another, a slat approximately at the center of the anti-scatter grid being aligned perpendicularly in relation to the plane of the anti-scatter grid and the other slats being tilted increasingly as they are increasingly further away from the center. The anti-scatter grid (10) absorbs the scattered radiation that is obliquely incident on the anti-scatter grid and allows through x-radiation from the direction of the x-ray source in the region of the radiation-transmissive slats. The anti-scatter grid (10) is represented in FIG. 1 in a flat embodiment, but curved embodiments, in particular in the form of a portion of the surface of a cylinder, are also conceivable.

Figure 2:
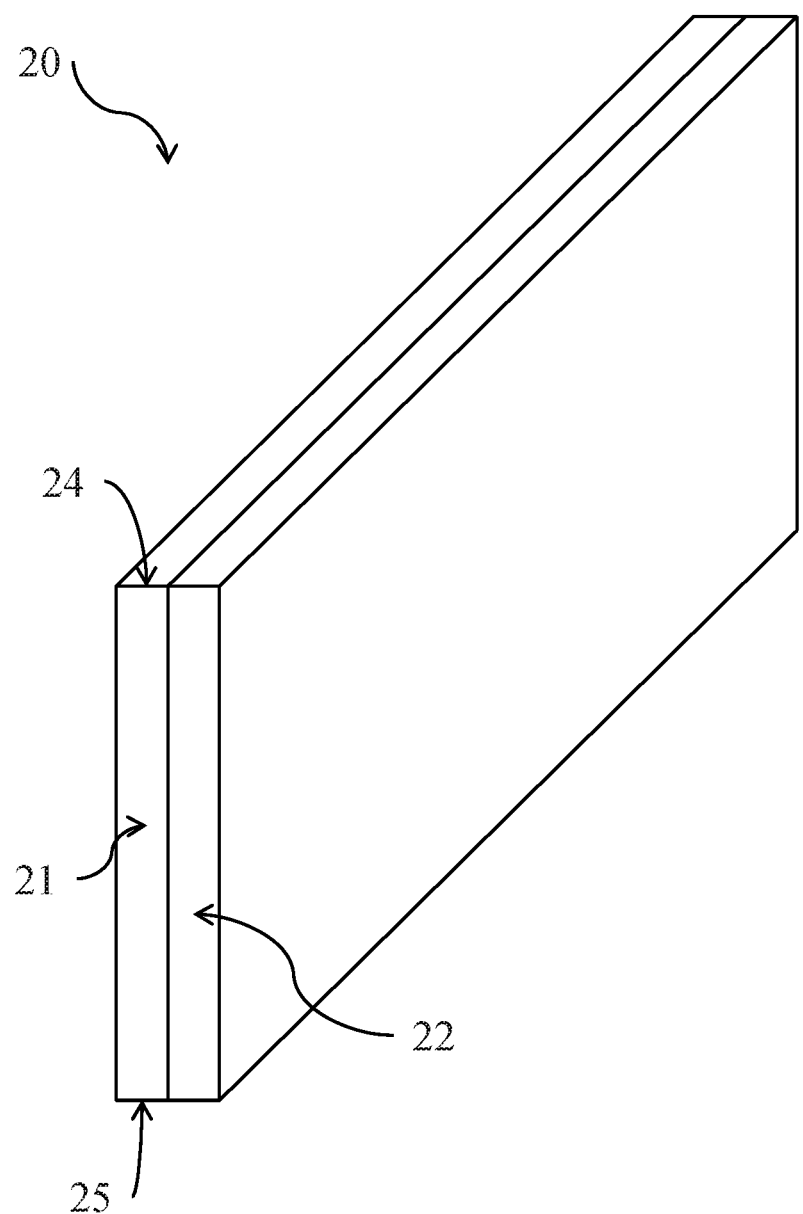
FIG. 2 shows a three-dimensional representation of an x-ray-absorbent slat with respect to a first embodiment of the invention.
Figure 3:
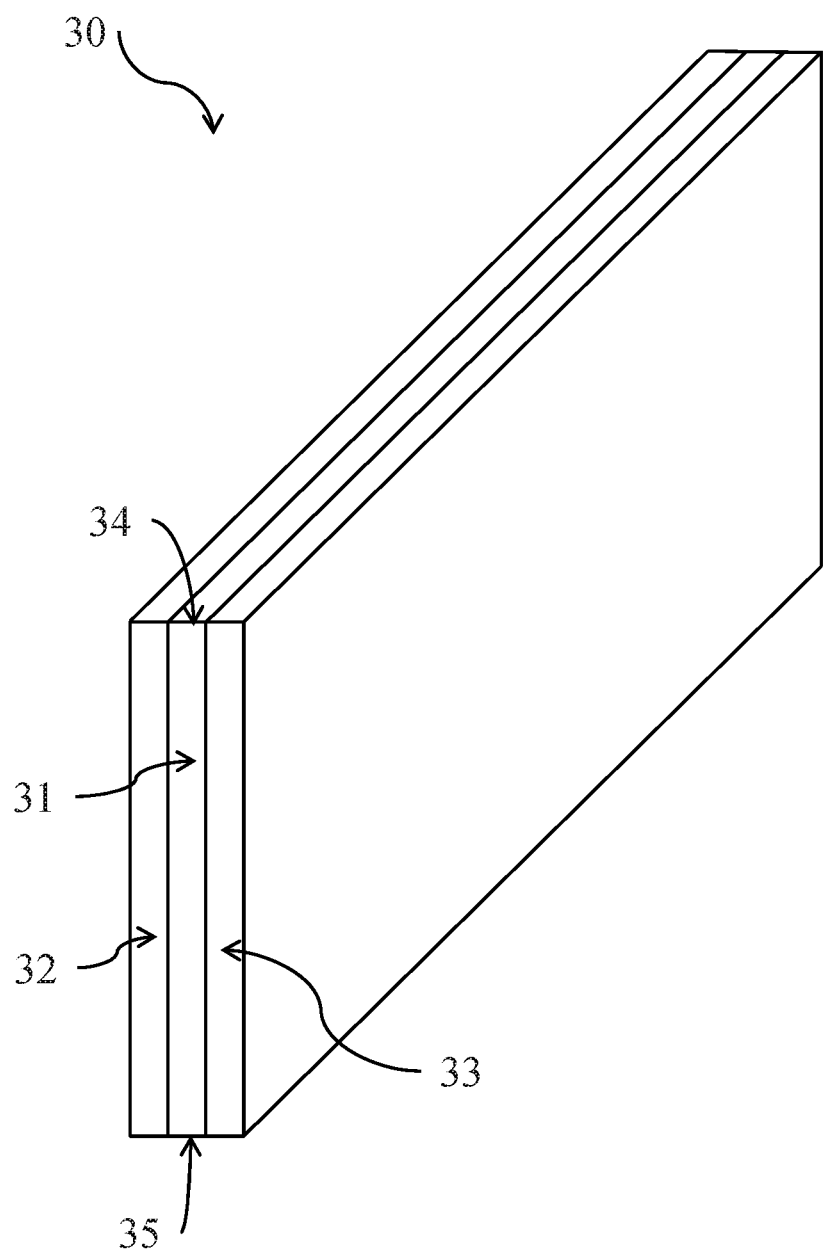
FIG. 3 shows a three-dimensional representation of an x-ray radiation-absorbent slat with respect to a second embodiment of the invention.

In FIG. 2 and FIG. 3, various embodiments of the x-ray-absorbent slats (16; 20; 30) are represented. The x-ray-absorbent slats (16; 20; 30) consist of a layer arrangement with a film-like substrate (21; 31), which is coated with at least one coating layer (22; 32, 33) of a highly x-ray-absorbent material such as tin, antimony, tantalum, tungsten, rhenium, iridium, platinum, gold or bismuth. A heavy metal, in particular a heavy metal with a good radiation absorption coefficient, such as iron, nickel, copper, molybdenum or tin, is chosen in particular as the material for the substrate (21; 31), the material of the substrate differing from that of the coating layer. The material of the coating layer usually has a higher x-radiation absorption coefficient in relation to the volume than the material of the film-like substrate. The thickness of the substrate (21; 31) and the thickness of the coating layer (22; 32, 33) are dependent on the material chosen and are dimensioned in such a way that the desired absorption properties of the slat can be achieved. FIG. 2 shows an embodiment of the x-radiation-absorbent slat (20) in which the film-like substrate (21) is coated on one side with a coating layer (22). In the embodiment according to FIG. 3, the film-like substrate (31) is coated on both sides with a respective coating layer (32, 33). The slat coated on both sides should be preferred if a relatively thick coating layer is required to achieve the required absorption performance. This is so because, in particular in the case of vapor deposition processes such as PVD, as the thickness of the layer increases it becomes more difficult to apply high-quality layers. As can be seen from FIG. 2 and FIG. 3, in both embodiments the coating layers extend over the entire two-dimensional extent of the substrate. As a result, effective shielding of the scattered radiation is achieved. In the case of embodiments in which the coating layer (22; 32, 33) absorbs x-radiation more than the substrate (21; 31), it is advantageous if the side edges (24, 25; 34, 35) of the substrate, which in the installed position of the slat are facing the x-ray source (24; 34) or facing away from the x-ray source (25; 35), are not coated with the highly x-ray-absorbent coating material and remain free. This allows undesired absorption of the primary radiation that is incident on the slat in these regions to be reduced to some extent.

The invention claimed is:

1. A slat for absorbing at least one of x-ray or gamma radiation in an anti-scatter grid having a layer configuration, the slat comprising:
   a film-shaped substrate of a molybdenum-based material; and
   at least one coating layer of a tungsten-based material.

2. The slat according to claim 1, wherein said film-shaped substrate has one side being coated with said at least one coating layer.

3. The slat according to claim 1, wherein said film-shaped substrate has two sides each being coated with at least one respective coating layer.

4. The slat according to claim 1, wherein the slat has a thickness of from 10 μm to 60 μm.

5. The slat according to claim 1, wherein said material of said substrate has a lower absorption coefficient with respect to x-ray or gamma radiation than said material of said at least one coating layer.

6. An anti-scatter grid for at least one of x-ray or gamma radiation, the grid comprising:
   a stack of alternately disposed first and second slats;
   said first slat being constructed according to claim 1; and
   said second slat being constructed of a material being substantially transmissive to at least one of x-ray or gamma radiation.

7. A method for producing a slat for absorbing at least one of x-ray or gamma radiation, the method comprising the following steps:
   producing a film from a molybdenum-based material;
   coating the film with a tungsten-based material; and
   cutting the film to size in strip shape.

8. The method according to claim 7, which further comprises carrying out the coating step by physical vapor deposition, chemical vapor deposition, thermal spraying or fused salt electrolysis.

9. The method according to claim 7, which further comprises applying the coating in a layer having a thickness of between 5 μm and 50 μm.

10. The method according to claim 7, which further comprises carrying out the step of producing the film with a thickness of between 5 μm and 30 μm.

11. A method of producing an anti-scatter grid, the method comprising the following steps:
   producing slats in a layer configuration for absorbing at least one of x-ray or gamma radiation;
   providing each slat with a film-shaped substrate of a molybdenum-based material; and
   providing each slat with at least one coating layer of a tungsten-based material.

* * * * *